Jan. 12, 1965

A. W. GELLERT 3,165,672

PRINTED CIRCUIT BASEBOARD

Filed June 15, 1959

INVENTOR.
ALVIN W. GELLERT
BY William R. Nolte
AGENT

United States Patent Office 3,165,672
Patented Jan. 12, 1965

3,165,672
PRINTED CIRCUIT BASEBOARD

Alvin W. Gellert, Phoenixville, Pa., assignor to Burroughs Corporation, Detroit, Mich., a corporation of Michigan
Filed June 15, 1959, Ser. No. 820,297
2 Claims. (Cl. 317—100)

This invention is directed to printed circuit panels and more particularly to such panels wherein the base boards are formed of metal.

Conventional printed circuit baseboards with conductors formed on one or both sides of the board, for example, by etching, electrodeposition, or any of a number of well known processes are now widely utilized. In most instances the baseboards are formed of thermoplastic materials which usually possess desirable characteristics for certain applications. These characteristics are usually obtained at the expense of other properties. By way of example, certain materials which may be used with a fibre-glass filler are capable of withstanding high temperatures. These materials however are attended by poor machining and punching characteristics while the reverse may be true for other laminated thermoplastic materials. A failing common to all plastic materials is the factor of low heat conductivity which on many occasions creates a serious cooling problem when a plastic printed circuit board must hold a component which emits a great deal of heat. Such a component may cause local hot spots with a consequent reduction in reliability. In some instances, moreover, the disparity between the coefficients of expansion of the plastic material and the metallic pattern affixed thereto may be so great that certain applications of heat will produce warpage of the board and corresponding fractures of the foil circuitry. Further disadvantages of plastic laminates involves difficulties in machining and in maintaining tolerances of the thickness dimension of the fabricated sheet. The latter is a serious disadvantage in those applications where a printed circuit board is inserted into receptacle.

It is an object of the present invention therefore to overcome the above disadvantages by providing a new and improved printed circuit panel wherein the baseboard is formed of metal.

Another object of the present invention is to provide a novel printed circuit baseboard of metal which is well adapted to support heat emitting components and provide a heat sink therefor.

In accordance with the above objects and first briefly described, the invention contemplates the provision of a printed circuit base board which is formed of metal, and which in the preferred form is aluminum. The metal base may be blanked from sheet stock to its final outline shaped including the punching of all holes therein required for mechanical mounting as well as for component wires. The base is then treated to cover all surfaces thereof with an electrically insulating coating. Conductors are suitably formed on one or both sides thereof as by etching, electrodeposition, silver screening or other well known processes and thereafter components may be mounted on the board.

For a better understanding of the present invention, together with other and further objects thereof, reference is made to the following description taken in connection with the following drawings.

FIG. 1 is a plan view of a printed circuit assembly showing a heat dissipative component secured to the printed circuit board in accordance with the invention;

FIG. 2 is a sectional view taken along the line 2—2 of FIG. 1;

Figure 3:
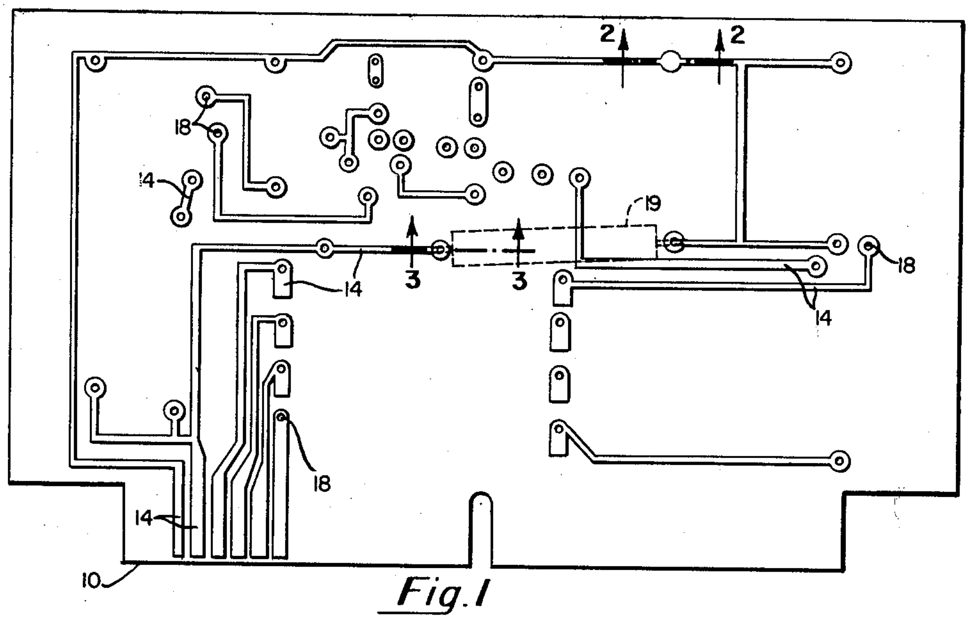
FIG. 3 is a sectional view taken along the line 3—3 of FIG. 1.

According to the invention, a metallic base board or support 10 is blanked to its final outline shape as shown in FIG. 1. The metal chosen in the preferred form of the invention may be aluminum, since it is low in cost, has good thermal conductivity, is easily machined and can be chemically heated to provide a layer of excellent electrical insulation without affecting its thermal conductivity. All the required holes 11 for component wires have been punched or otherwise drilled therein. The blank or board is then subjected to a preliminary anodizing treatment to produce a continuous film of oxide 13 to cover all of the exposed surfaces of the blank. This may be accomplished by any well known manner; for example, by making the plate or blank the anode of an electrolytic cell with chromic, sulphuric or oxalic acid as the electrolyte. The chromic anodizing process has produced an acceptable oxide film. Such a film or surface oxide coating constitutes an excellent electrically insulating material to prevent the leakage of current and additionally is able to resist dielectric puncture. Thus the oxide film in addition to being a good insulator, is also a good dielectric. The aluminum oxide film 13 possesses excellent insulating properties over a wide temperature range, and moreover forms an excellent basis for the application of other coatings. Accordingly, this property is well utilized by applying conductors to one or both surfaces thereof as by etching, electrodeposition, silver screening or other processes. The etching process has been found highly satisfactory in which pure copper foil 14 is laminated to one side of the aluminum board, as seen in FIG. 2, by using well known bonding agents such as dry epoxy film or a suitable liquid cement 15 and applying heat and pressure to complete the bonding operation. Thereafter the holes through which the component wires pass are filled from the lower side as seen in FIG. 2 with epoxy resin or some equivalent suitable material 16.

Figure 4:
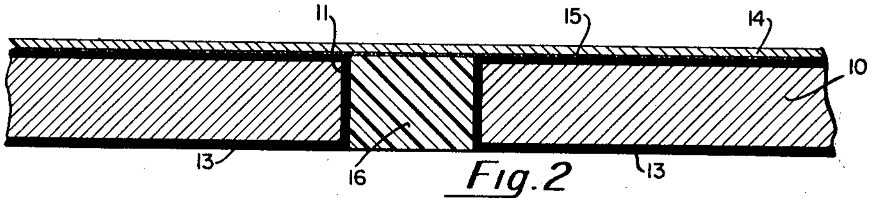
FIG. 4 is a sectional view similar to FIG. 3 showing electrical circuitry on both sides of the panel.

In the event that a board with copper foil on one side only is required, the epoxy resin in the holes is permitted to cure. If a board is required having printed circuitry on both sides, the lower surface of the board as seen in FIG. 2 is laminated with a second sheet of copper foil 17 in the same manner as above and as seen in FIG. 4. The board is then again subjected to heat and pressure for the final bonding operation. When so completed, the application of the resist pattern, the etching and the drilling of the holes 18 may be accomplished in the conventional manner as follows: The copper foil is cleaned and coated with a light-sensitive material and it is then exposed to ultraviolet light through a negative until a latent image is developed. A dye reveals the acid resist pattern for inspection. Acid is then applied and etches the copper from those areas that are not a part of the electrical circuit pattern. This may be performed on both sides of the printed circuit board at the same time. Thereafter the dye is removed and connecting holes 18 are drilled through from front to back through the epoxy cores 16. Electrical components 19 are then assembled on the board and solder may be used to electrically connect the component leads 22 to the etched circuits.

Referring again to FIG. 3 a heat dissipative electrical component 19, such as a resistor, a transistor, etc. is shown mounted in intimate contact with the printed circuit board. An alternative form of mounting for such heat dissipative components is shown in FIG. 4. Both mountings provide a highly effective heat sink to dissipate the heat from the component. When mounted as in FIG. 4 it is desirable to make provisions in the etching pattern, so that there is a copper pad 20 of a size corresponding to the component 19 for the latter to rest upon. This pad facilitates the thermal connection between the base of the component and the metal base board. The latter pad may be isolated with respect to the electrical circuit paths on the board. Since no electrical connection exists between such isolated pads on the surface of the board, it is possbile to mount components such as transistors whose cases form a circuit connection to the component, without any danger of a spurious circuit path existing between the cases of such components.

Figure 5:
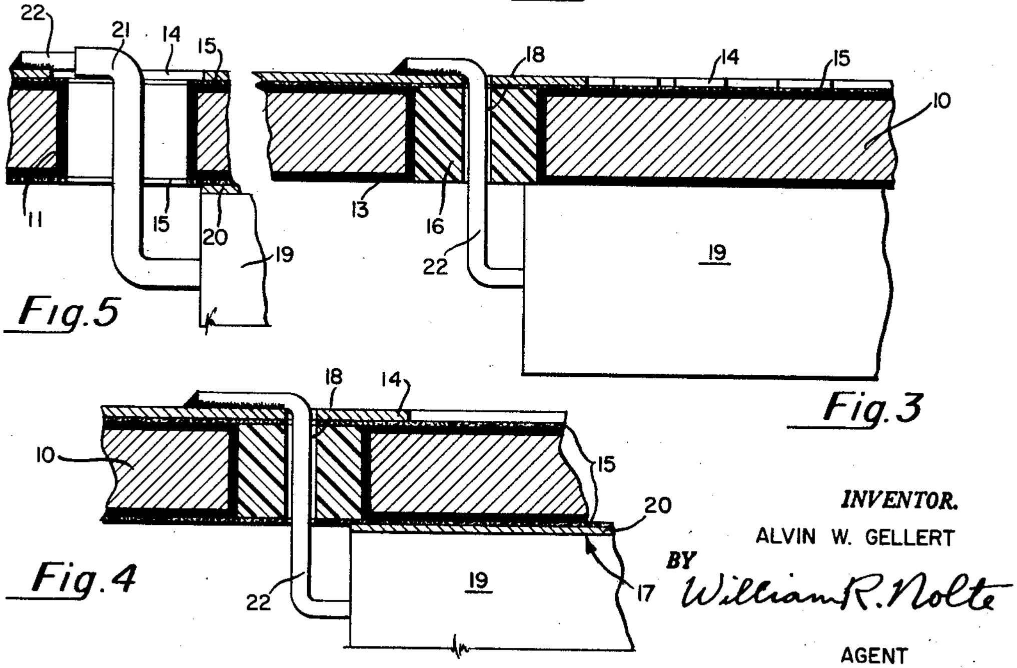
FIG. 5 is a sectional view similar to FIG. 4, showing an insulated component wire extending through the panel.

Referring now to FIG. 5, a further form of the invention is shown which is identical to that shown in FIGS. 3 and 4 except that the epoxy plug 16 has been omitted. In lieu thereof an insulating sleeve 21 of the proper length is shown surrounding the component lead wire 22.

From the foregoing description it will be appreciated that the present invention eliminates the disadvantages associated wtih conventional plastic laminate printed circuit boards by providing a metal board with an insulating coating theron, and having the advantages of high heat resistance, high thermal conductivity, excellent machinability, non-warpage, thickness accuracy, and low cost.

Having thus described the preferred embodiment of the invention for purposes of illustration, it is to be understood that the inventive concept may be employed in other forms without departing from the scope of the invention.

What is claimed is:

1. A printed circuit board assembly including in combination, a printed circuit board of one part construction comprising a metal panel provided on external surfaces thereof with an electrically insulative coating of good thermal conductivity, electrically conductive strips secured on said insulative coating adjacent one surface of said panel, said panel having laterally spaced holes extending through it and said insulative coating, and a heat emissive electrical component having a body portion which includes an exterior surface urged in direct physical contact against the insulative coating on the opposite surface of said panel by wire leads projecting from the component and extending through said holes, insulative means disposed between said wire leads and the wall surfaces defining said holes, and with each of said wire leads being bent to engage the conductive strips in the marginal areas surrounding said holes.

2. A printed circuit board assembly including in combination, a printed circuit board of one part construction comprising an aluminum panel and provided on opposite external surfaces thereof with an electrically insulative coating of aluminum oxide, electrically conductive strips secured to said insulative coating on one surface of said panel, said panel having laterally spaced holes extending through the strips and the panel, a metallic pad formed of the same material as said conductive strips and secured in its entirety to said coating on said other surface, a heat emissive electrical component having a body portion which includes a surface which is urged in direct physical contact on said pad and having wire leads projecting from the component and extending through at least one of said holes, insulated means disposed between said wire leads and the wall surfaces defining said at least one of said holes, and with each of said wire leads being bent to engage the conductive strips in the marginal areas surrounding said at least one of said holes.

References Cited in the file of this patent

UNITED STATES PATENTS

| | | |
|---|---|---|
| 1,659,309 | Auld | Feb. 14, 1928 |
| 2,244,009 | Hiensch et al. | June 3, 1941 |
| 2,408,910 | Burnham | Oct. 8, 1946 |
| 2,570,017 | Wedig | Oct. 2, 1951 |
| 2,668,933 | Shapiro | Feb. 9, 1954 |
| 2,773,239 | Parker | Dec. 4, 1956 |
| 2,808,576 | Brown | Oct. 1, 1957 |
| 2,837,619 | Stein | June 3, 1958 |
| 2,881,364 | Demer et al. | Apr. 7, 1959 |
| 2,912,624 | Wagner | Nov. 10, 1959 |
| 2,916,805 | Plesser | Dec. 15, 1959 |
| 2,917,286 | Deakin | Dec. 15, 1959 |
| 2,923,860 | Miller | Feb. 2, 1960 |
| 2,974,284 | Parker | Mar. 7, 1961 |